United States Patent [19]

Flagello et al.

[11] Patent Number: 4,840,923
[45] Date of Patent: Jun. 20, 1989

[54] SIMULTANEOUS MULTIPLE LEVEL INTERCONNECTION PROCESS

[75] Inventors: Donis G. Flagello, Ridgefield, Conn.; Janusz S. Wilczynski, Ossining; David F. Witman, Pleasantville, both of N.Y.

[73] Assignee: International Business Machine Corporation, Armonk, N.Y.

[21] Appl. No.: 262,208

[22] Filed: Oct. 19, 1988

Related U.S. Application Data

[63] Continuation of Ser. No. 857,275, Apr. 30, 1986, abandoned.

[51] Int. Cl.$^4$ .................................. H01L 21/312
[52] U.S. Cl. .................................. 437/189; 437/195; 437/203; 437/915; 437/978; 156/643; 156/644; 156/646; 148/DIG. 20; 148/DIG. 164
[58] Field of Search .............. 437/203, 189, 915, 195; 156/656, 652, 643, 644

[56] References Cited

U.S. PATENT DOCUMENTS

| | | | |
|---|---|---|---|
| 4,092,442 | 5/1978 | Agnihotri et al. | 204/192.32 |
| 4,172,004 | 10/1979 | Alcorn et al. | 156/652 |
| 4,179,800 | 12/1979 | Takaba et al. | 156/656 |
| 4,184,909 | 1/1980 | Chang et al. | 156/643 |
| 4,285,780 | 8/1981 | Schachter | 156/656 |
| 4,308,090 | 12/1981 | Te Velde et al. | 156/652 |
| 4,341,591 | 7/1982 | Tamutus | 156/652 |
| 4,517,050 | 5/1985 | Johnson et al. | 156/643 |
| 4,521,262 | 6/1985 | Pellegrino | 156/656 |
| 4,523,372 | 6/1985 | Balda et al. | 29/590 |
| 4,536,949 | 8/1985 | Takayama et al. | 29/590 |
| 4,582,563 | 4/1986 | Hazuki et al. | 156/643 |
| 4,614,021 | 9/1986 | Hulseweh | 29/590 |
| 4,663,831 | 5/1987 | Birrittella et al. | 357/34 |

Primary Examiner—Brian E. Hearn
Assistant Examiner—Beverly A. Pawlikowski
Attorney, Agent, or Firm—Sughrue, Mion, Zinn, Macpeak & Seas

[57] ABSTRACT

A system of establishing a conductive via path between spaced interlevel conductors. Successive layers of metallization separated by a dielectric are built. The vias are opened in one step to eliminate interlevel mashing. The system employs annular pads at locations where contact may be established to another wiring level. The vias are self-aligned and taper from top metal to first level contact. The system is applicable both chip-wise and carrier-wise.

11 Claims, 2 Drawing Sheets

SIMULTANEOUS MULTIPLE LEVEL INTERCONNECTION PROCESS

This is a continuation of Ser. No. 06/857,275, filed on Apr. 30, 1986 abandoned.

BACKGROUND OF THE INVENTION

This invention is directed to a scheme of connecting two or more metal levels in a semiconductor package by a via connection. Specifically, this invention is directed to packaging schemes employing multiple level wiring. Such multiple level wiring patterns may exist at the chip (wafer level) or on a wafer carrier having multilevel conductors and interconnections from one level to another.

An example of a prior art multilevel conductor interconnection system is illustrated in IBM TDB Vol. 23, No. 10, pp. 4751-4752 (March 1981).

As disclosed therein, on a substrate surface circuit elements are placed. The device is then sequentially built up by providing a resist layer followed by patterning of the recess for contact holes (vias). The holes are then created and the next layer, a first metal is then patterned. Alignment between the vias and the metal layer is critical.

Processing then continues then by applying a second resist layer and patterning that layer to provide for additional vias. These via must align with the previously defined via in the lower resist layer. Patterning of the second metal layer proceeds and then the steps continue to define a third resist layer. Consequently, as illustrated in this typical prior art scheme, each resist layer is separately patterned. Additionally, each metal layer lying on top of a respective resist layer must be separately patterned. Given the number of patterning steps, production costs for such a device are high. Moreover, a common source of defects which contributes to yield losses deals with the misalignment between vias at various levels. Thus, for example, as illustrated in TDB, the via existing between the top metal and of the circuit element comprises three segments. A misalignment in the patterning to create the holes for any of those segments can result in defective formation of a via. In extreme cases of misalignment an internal short-circuit may result, rendering the entire package unusable.

While the problem of creating aligned vias with a minimum number of steps has been defined relative to multilayer packaging for circuit elements, the same problem exists relative to internal metallization of the device elements themselves. That is, separate metallization for each individual stage. To date, only by exact pattern alignment can yield losses be minimized. Consequently, techniques exist to increase production capacity, the art has been unable to provide a solution which provides the required accuracy yet, at the same time, reduces overall manufacturing costs.

Contemporary packaging schemes employ four discrete levels of metal and seven masking steps with interconnection between levels are required. Consequently, there exists a need in the technology to find the scheme which reduces the number of masking steps while maintaing accuracy.

A second problem related to prior art techniques of sequential patterning and etching is that of contamination which may exist at any individual level. In order to remove contaminants which may be trapped within the package as the vias and metal layers are successively defined, elaborate precautions are employed to reduce the possibility of entrapment of contaminants. This in turn contributes to the overall increase in manufacturing cost.

SUMMARY OF THE INVENTION

Given the deficiencies in the prior art, it is an object of this invention to define a scheme for providing connections between two or more metal levels that reduces the number of processing steps.

Another object of this invention is to define a scheme which eliminates alignment errors, whether random or progressive in the definition of multilevel vias.

Yet another object of this invention is to provide a unique via construction which eliminates alignment and contamination problems in a multilayer package.

These and other objects of this invention are attained by a method of establishing a conductive via path between spaced interlevel conductors wherein upper level metal circuitry above a first metal line is provided with annular paths such that the interconnections are defined in a single via establishment step. In accordance with this method, the first level having a pattern of conductive material is laid down on a substrate. Then, successive alternating layers of insulator or dielectric, and a layer of conductive material, are built up. The only patterning is of the conductive material. Each pattern of conductive material has annular or path locations where interconnections may be opened between levels. But when the final top metal is applied (or at some intermediate stage), the package is patterned to create via paths by opening appropriate locations through the dielectric layers to an appropriate metal layer. Via paths are then filled with a conductive material.

In accordance with this technique, patterning at the resist level to create via openings for that level per se are eliminated. Consequently, the number of masking and opening steps is reduced.

Because the via paths are opened in one step, self-alignment of the via path takes place. Contaminants which may exist at a particular level are eliminated since the packaging is completed at the time the via paths are opened.

Additionally, filling of the via paths takes place in a manner which prevents shorts and guarantees electrical continuity in the via path. That is, in prior techniques with the via paths opened on a layer-by-layer basis, the via path comprises a series of stacked trapezoids. The propensity of having incomplete filling at any individual level exists. Moreover, the problem of escapement of conductive material into a particular level remains if alignment is not achieved. In accordance with this invention, the simultaneous opening of a via path results in a passage which progressively decreases from top metal down to the metal layer to be contacted. Thus, complete filling is achieved expeditiously without the problems inherent in the prior art technique.

This invention will be explained in greater detail by referring to the attached drawing and a description of the preferred embodiment which follows.

DESCRIPTION OF THE PREFERRED EMBODIMENTS

Figure 1:
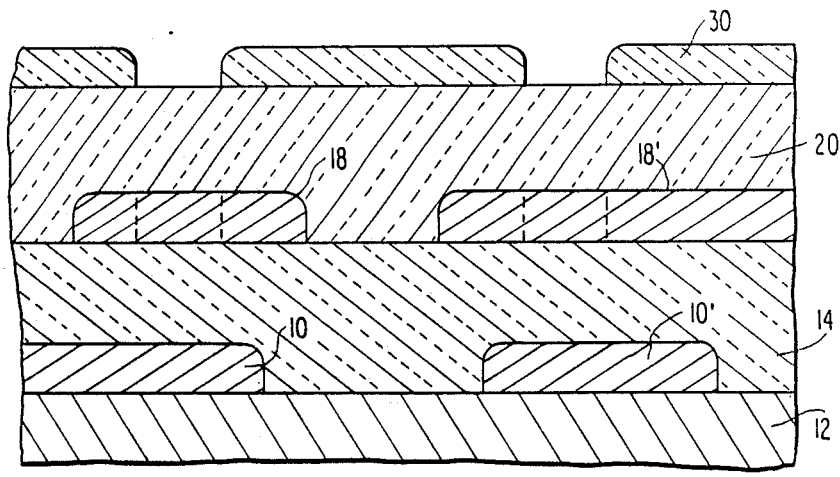
FIG. 1 is a schematic cross-section of structures prior to final etching illustrating interconnection between two metal layers.

Referring now to FIG. 1, a cross sectional view of the packaging structure prior to final etch is illustrated. Onto a substrate 12, a first metal layer 10 is deposited. This metal layer is defined in a conventional manner, for example, by lift-off techniques which are well known in the art. On top of the first metal layer, dielectric layer 14 is deposited.

Figure 4:
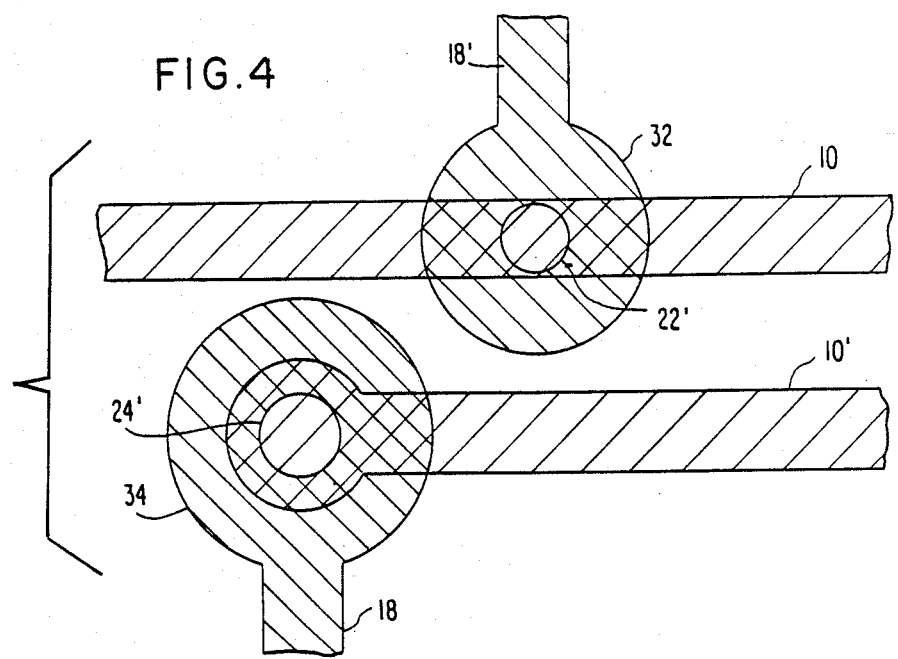
FIG. 4 is a top view looking down onto the second level metal through the intermediate dielectric and then down to the first level metal.

A second metal layer is deposited over the first dielectric layer 14. The second metal layer is patterned using the conventional techniques and includes annular or enlarged regions where contacts may be required to the first metal layer. Such are illustrated in FIG. 4.

A second layer of dielectric material 20 is then deposited over the second metal layer 18. It should be noted in accordance with this invention there is no patterning of either the first or second dielectric layers 14 and 18.

Processing continues until all metal layers have been defined. That is, while FIG. 1 shows two such metal layers, it is to be understood that the invention is not limited; any number of metal layers may be employed. When the final number of metal layers is determined, an etch mask 30 is placed on the top surface. FIG. 1 illustrates the condition of the mask following exposure and development to produce the pattern for the vias. This is followed by etching, using wet or dry techniques through the top dielectric layer 20, second metal layer 18, the first dielectric layer 14 and stopping at the first metal layer 10.

Figure 2:
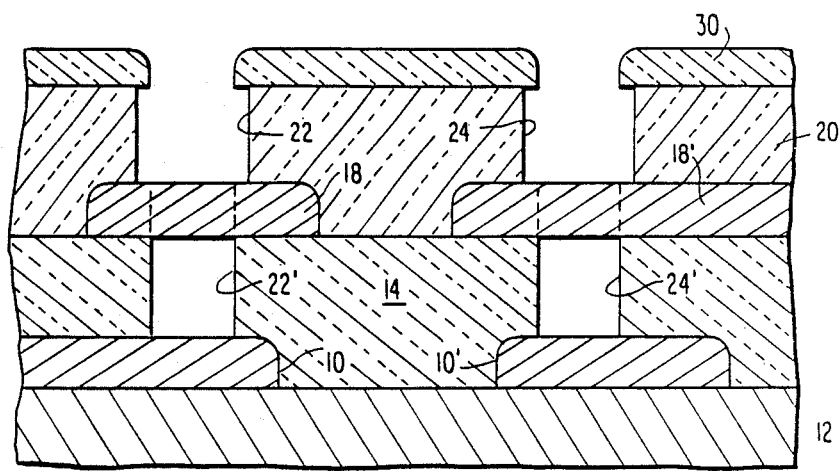
FIG. 2 illustrates a cross section of the structure of FIG. 1 following etch.

FIG. 2 illustrates a cross section of such a structure following etch. It is illustrated in FIG. 2 two self-aligned vias 22 and 24 are defined. The vias progressively decrease in size. Typically a $2\mu$ stepwise decrease from one level to the other occurs. Thus, if the via 22 has a diameter of approximately $10\mu$ through the second dielectric layer 20, the diameter through the first diameter layer 14 would be in the order of $8\mu$.

Figure 3:
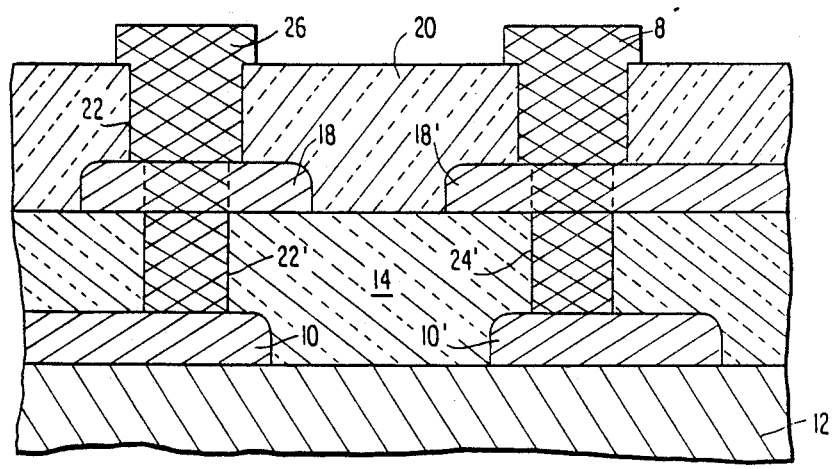
FIG. 3 illustrates a cross-section of the structure following etch stripping and plating.

FIG. 3 illustrates stripping of the etch mask and final plating of the via opening. Removal of the resist layer 30 is optional.

The via openings 22 and 24 as illustrated in FIG. 3 are filled with a conductor such as a solder paste, plated copper or gold. In the case of the use of solder paste, conductor may be applied by squeezing into the via openings or by other manual techniques. Additionally, sputter filling could take place. The device may be finished by Chem-mech polishing to define plated vias having terminals 26 and 28 as illustrated in FIG. 3.

Referring now to FIG. 4, a top level view showing the two levels of metal with the annular regions in accordance with this invention is illustrated. Metal line 10 is a continuous line existing in the first metal level. The metal line 10' represents a terminal. A second level metal 18 and 18' ends with annular enlarged regions 32 and 34. Those annular regions substantially overlap the first level metal. The via opening existing through the first dielectric layer is illustrated terminating at the first metal level.

Figure 5:
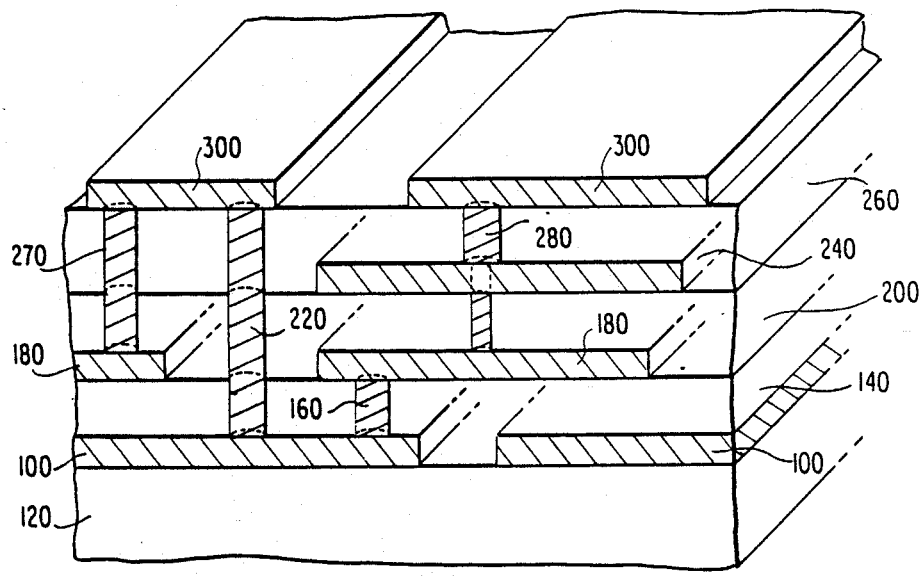
FIG. 5 is a cut away perspective illustrating interconnections between three levels of metallization in accordance with the present invention.

FIG. 5 is a schematic perspective view illustrating various interconnect techniques employing the vias of this invention. As illustrated in FIG. 5, three layers of metallization are employed plus the top contact layer 300. The completed device is built on the substrate 120 and and comprises metal pattern layers 100, 180 and 240. Between each of the metal layers is a dielectric layer 140, 200 and 260. It is appreciated that the layers fill all spaces between adjacent metallization layers. For purposes of illustration the cross-hatching has been eliminated.

FIG. 5 illustrates various via connections between the metallization layers. For example, via 270 extends from top metal 300 through dielectric layers 200 and 260 to contact the top surface of the second metal layer 180. Via 220 extends from top metal layer 300 through three dielectric layers 140, 200, and 260 to terminate on the first metal layer 100. Vias from one metal layer to another are illustrated as vias 160 and 20. The via extending from the top metal layer 300 through intermediate metal layer 240 down to the intermediate metal layer 180 is illustrated as via 280. In all cases, the vias are self-aligned given the processing of this invention. For purposes of explanation, the metal filling of each of the openings has been deleted from this drawing.

In accordance with this invention improvements in alignment occur in the formation of vias 220, 270 and 280. Via 160 extending between adjacent layers would be created using conventional techniques.

The choice of material for metal layers 100, 180 and 240 is as typically, in the case of a chip carrier device, copper, aluminum or gold. Use of this invention as the chip-wise level would lay down the metal by evaporation and sputtering techniques and employ a lower resistance metal. Typically, the metal lines at a chip level would be an aluminum-copper-silicon composite having approximately 4 to 5% copper and approximately 1% silicon. The dielectric layers in the case use of this invention in a packaging context would be polyamides, silicon-containing polyimides or novolac resins. The etching to create the via openings could use an oxygen plasma if the dry process is selected. However, for opening vias for two levels, i.e. 160 in FIG. 5 a wet process, known in the art, can be employed.

At the chip-wise level, the insulating material would typically be silicon dioxide. A suitable etchant for the oxide would be $CF_4$.

As can be appreciated from FIG. 5, increased metallization density occurs using this technique since the vias are inherently self-aligned. Consequently, in addition to eliminating masking steps and removing the critical alignment problem when RIE is used as the etch step of choice for sequential processing, this invention allows for compactness in ultimate processing design.

Thus, it is apparent that the system in accordance with this invention may be used at the packaging or multilayer ceramic level as well as the chip level and is generally applicable in the construction devices having multiple levels of metal and insulator. It is also apparent that modifications of this invention may be practiced without departing from the central scope thereof.

We claim:

1. A method of establishing a conductive via path between spaced interlevel conductors comprising the steps of:

defining a first level having a pattern of a conductive material and applying a first dielectric layer over said first level of conductive material;

applying a second level having a pattern of a conductive material with via openings over said first dielectric layer;

applying a second dielectric layer over said second level of conductive material;

creating a via path by opening said dielectric layers through said via openings in said conductive level and terminating said opening at the first conductive level; and filling said opening with a conductive material.

2. The method of claim I, wherein said step of applying a second level of conductive material comprises the step of providing an enlarged area in said second level in a zone where a via path may be created, said enlarged area overlapping said conductive material in said first conductive level.

3. The method of claim 1, wherein the step of creating said via path comprising the steps of: applying a resist pattern on said second dielectric layer, developing said pattern and etching through said second dielectric layer, said second conductive level and said first dielectric level.

4. The method of claim 3, wherein said etch is a wet etch.

5. The method of claim 3, wherein said etch is a dry etch.

6. The method of claim 3 further comprising the step of removing residual resist prior to filling said via paths.

7. The method of claim 1 further comprising the steps of prior to creating said via paths applying a third level having a pattern of conductive material over said second dielectric layer and a third dielectric layer over said third level and wherein said step of creating said via path includes opening, opening said third level and said third dielectric layer.

8. The method of claim 1, wherein said first and second levels of conductive patterns comprise wiring levels of a semiconductor chip carrier.

9. The method of claim 8, wherein said first and second dielectric layers comprise polyimide.

10. The method of claim 1, wherein said first and second levels of conductive patterns comprise wiring interconnections of a semiconductor chip.

11. The method of claim 1, wherein the step of creating a via path comprises simultaneously opening said layers at a plurality of predetermined spaced locations.

* * * * *